United States Patent
Hamamoto

(10) Patent No.: US 8,643,105 B2
(45) Date of Patent: Feb. 4, 2014

(54) SEMICONDUCTOR MEMORY DEVICE AND MANUFACTURING METHOD THEREOF

(75) Inventor: Takeshi Hamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 828 days.

(21) Appl. No.: 12/263,762

(22) Filed: Nov. 3, 2008

(65) Prior Publication Data

US 2009/0114989 A1    May 7, 2009

(30) Foreign Application Priority Data

Nov. 5, 2007   (JP) .................................. 2007-287311

(51) Int. Cl.
*H01L 27/12*  (2006.01)

(52) U.S. Cl.
USPC ................... 257/347; 257/E21.409

(58) Field of Classification Search
USPC .......... 257/347, 349, 409, E29.117, E29.273, 257/367, E29.009; 438/140, 454
See application file for complete search history.

(56) References Cited

U.S. PATENT DOCUMENTS

| | | | | |
|---|---|---|---|---|
| 6,271,566 B1 * | 8/2001 | Tsuchiaki | ...................... | 257/347 |
| 6,538,916 B2 * | 3/2003 | Ohsawa | .......................... | 365/149 |
| 6,730,964 B2 * | 5/2004 | Horiuchi | ........................ | 257/347 |
| 8,217,435 B2 | 7/2012 | Chang et al. | | |
| 2004/0169226 A1 * | 9/2004 | Oyamatsu | ....................... | 257/347 |
| 2006/0214227 A1 * | 9/2006 | Nakajima | ....................... | 257/347 |
| 2007/0284661 A1 * | 12/2007 | Yamada et al. | ............... | 257/347 |
| 2008/0149984 A1 | 6/2008 | Chang et al. | | |

FOREIGN PATENT DOCUMENTS

| | | |
|---|---|---|
| JP | 2002-118255 A | 4/2002 |
| JP | 2003-17691 A | 1/2003 |
| JP | 2008-160125 A | 7/2008 |

OTHER PUBLICATIONS

Office Action issued Aug. 3, 2012 in Japanese Patent Application No. 2007-287311 with English language translation.

* cited by examiner

*Primary Examiner* — Vongsavanh Sengdara
(74) *Attorney, Agent, or Firm* — Oblon, Spivak, McClelland, Maier & Neustadt, L.L.P.

(57) ABSTRACT

This disclosure concerns a semiconductor memory device including a semiconductor substrate; a buried insulation film provided on the semiconductor substrate; a semiconductor layer provided on the buried insulation film; a source layer and a drain layer provided in the semiconductor layer; a body region provided in the semiconductor layer between the source layer and the drain layer, and being in an electrically floating state, the body region accumulating or discharging charges to store data; a gate dielectric film provided on the body region; a gate electrode provided on the gate dielectric film; and a plate electrode facing a side surface of the body region via an insulation film, in an element isolation region.

5 Claims, 21 Drawing Sheets

FIRST EMBODIMENT

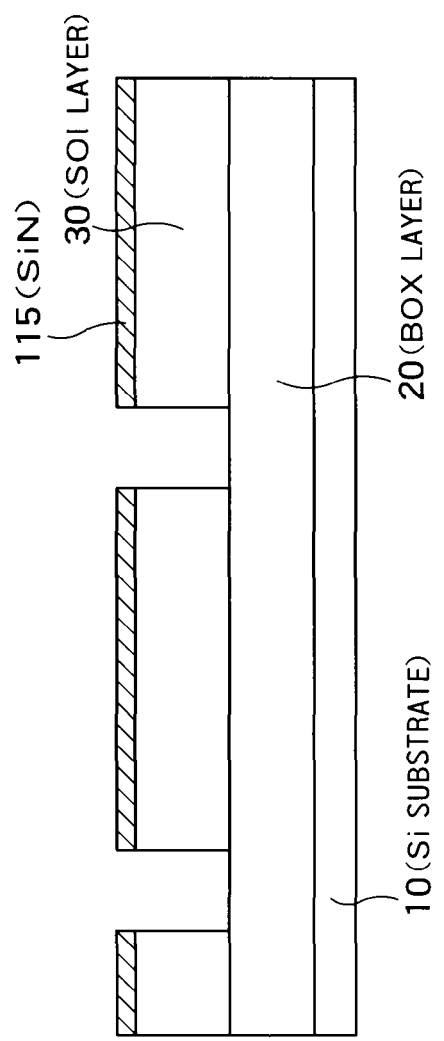
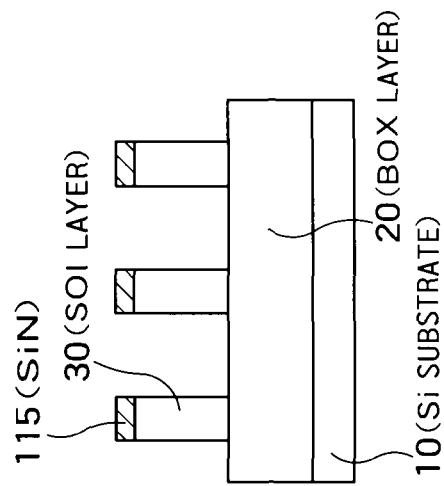
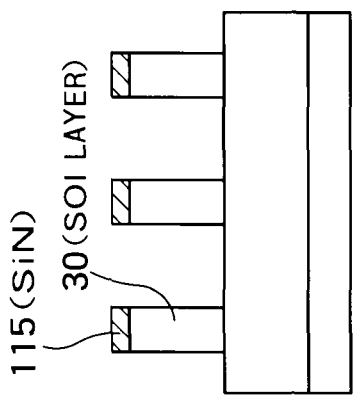
FIG. 6A
FIG. 6B
FIG. 6C

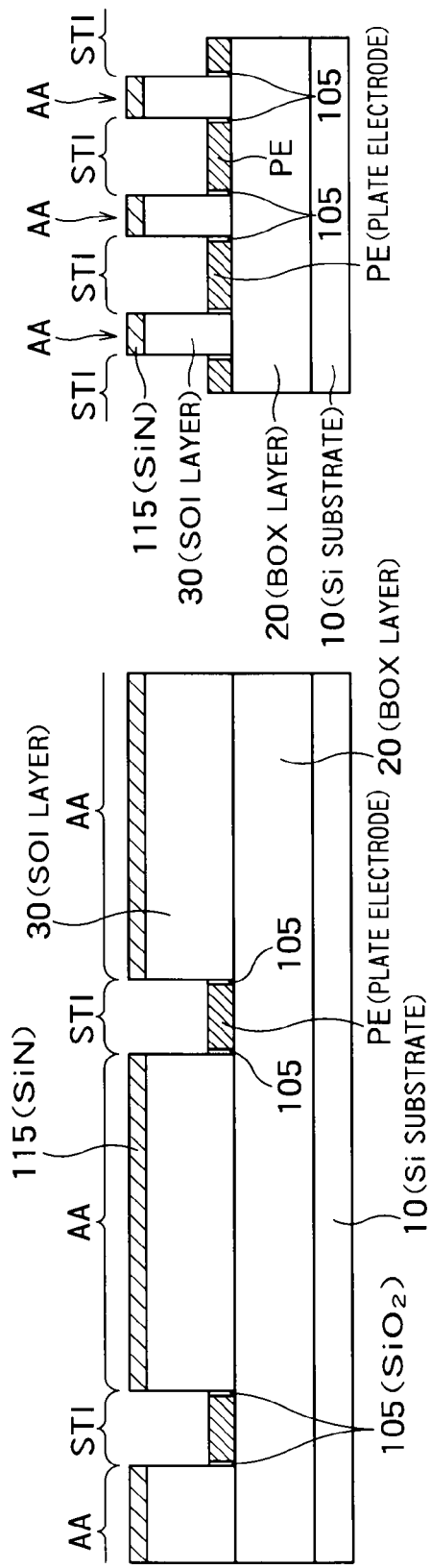
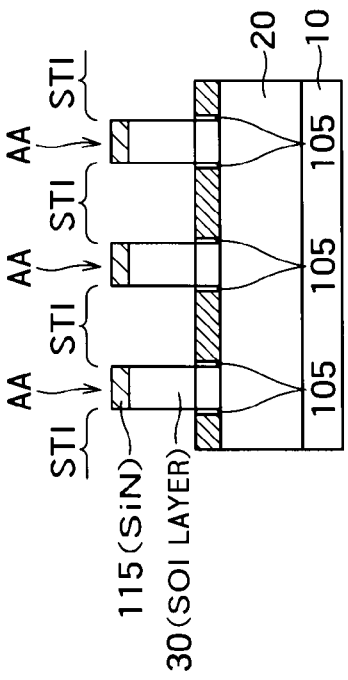
FIG. 8A
FIG. 8B
FIG. 8C

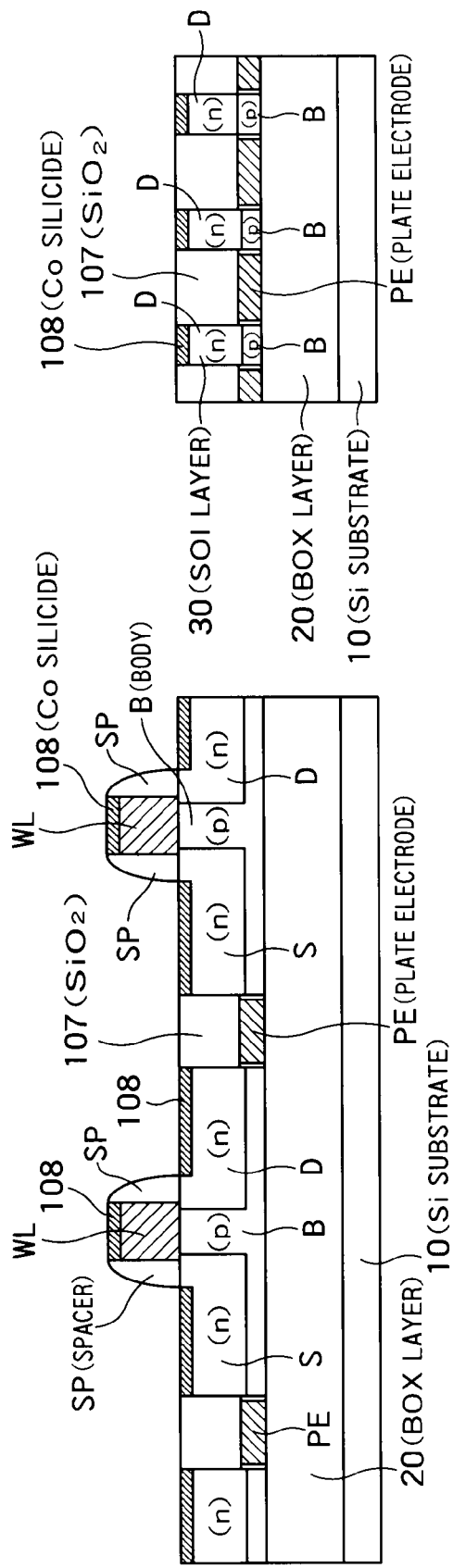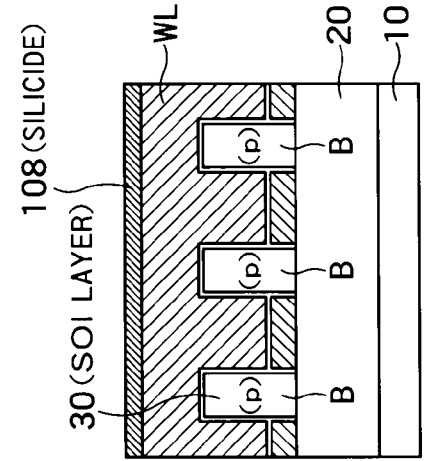
FIG. 12A
FIG. 12B
FIG. 12C

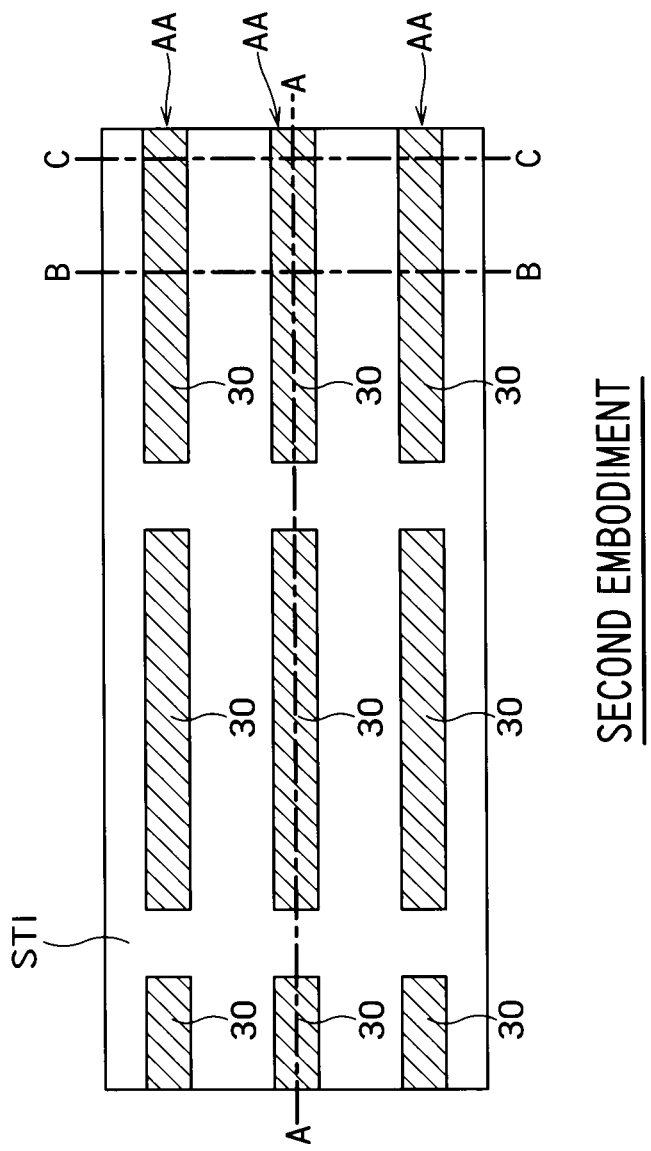
FIG. 13 SECOND EMBODIMENT

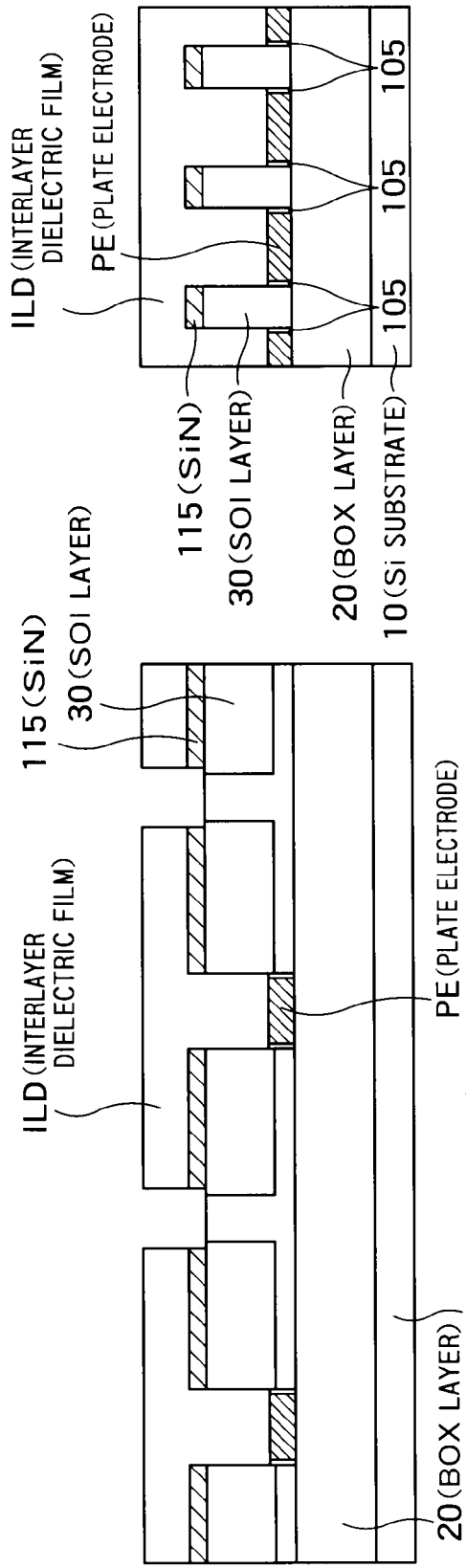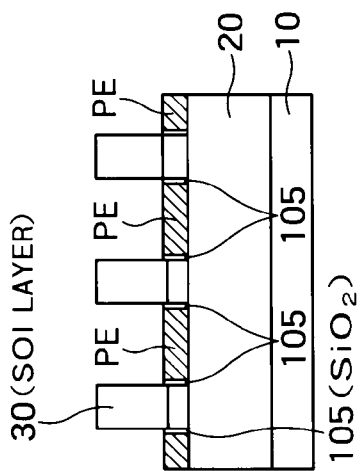

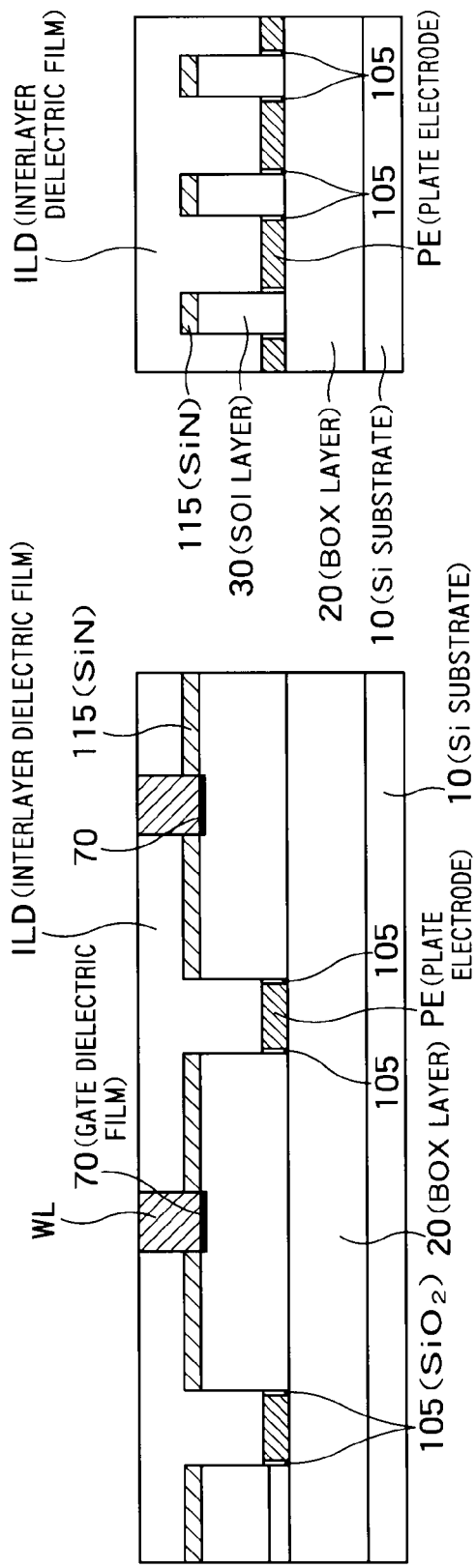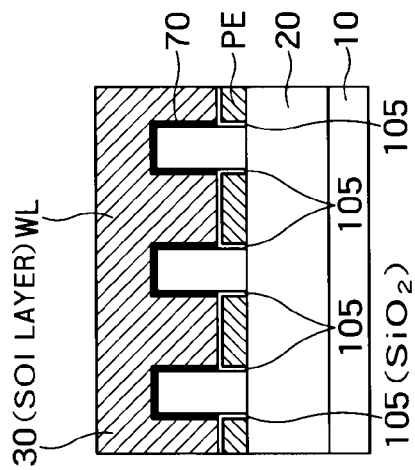

SEMICONDUCTOR MEMORY DEVICE AND MANUFACTURING METHOD THEREOF

CROSS-REFERENCE TO RELATED APPLICATION

This application is based upon and claims the benefit of priority from the prior Japanese Patent Application No. 2007-287311, filed on Nov. 5, 2007, the entire contents of which are incorporated herein by reference.

BACKGROUND OF THE INVENTION

1. Field of the Invention

The present invention relates to a semiconductor memory device and a manufacturing method thereof.

2. Related Art

In recent years, there has been an FBC (Floating Body Cell) memory device for a semiconductor memory device expected as a memory alternative to IT (Transistor)-IC (Capacitor) type DRAMs. The FBC memory device has an FET (Field Effect Transistor) including a floating body (hereinafter, also "body"), formed on an SOI (Silicon On Insulator) substrate. The FBC memory device stores data "1" or data "0" based on large and small numbers of majority carriers (holes) accumulated in this body.

In general, a signal amount (a potential difference between the data "1" and the data "0") of the FBC memory is determined based on a ratio of body-gate capacitance to body-substrate capacitance. When the body-gate capacitance is small, a signal amount becomes large, and when the body-substrate capacitance is large, a signal amount becomes larger. Therefore, to increase the signal amount, it is desired to decrease the body-gate capacitance or to increase the body-substrate capacitance. However, when the body-gate capacitance is small, a word line voltage at data writing needs to be increased. Unless the word line voltage is increased, a charge amount accumulated in the body at the data writing decreases.

Therefore, it is preferable to increase the signal amount by increasing the body-substrate capacitance. In the FBC memory employing an FIN-type MISFET (Metal-Insulator Semiconductor FET), for example, word lines are provided on an upper surface and on both side surfaces of a channel region. Therefore, because the body-gate capacitance of the FIN-type FBC is usually larger than that of a planar type MISFET, it is more preferable to increase the body-substrate capacitance to maintain or increase the signal amount.

SUMMARY OF THE INVENTION

A semiconductor memory device according to an embodiment of the present invention comprises: a semiconductor substrate; a buried insulation film provided on the semiconductor substrate; a semiconductor layer provided on the buried insulation film; a source layer and a drain layer provided in the semiconductor layer; a body region provided in the semiconductor layer between the source layer and the drain layer, and being in an electrically floating state, the body region accumulating or discharging charges to store data; a gate dielectric film provided on the body region; a gate electrode provided on the gate dielectric film; and a plate electrode facing a side surface of the body region via an insulation film, in an element isolation region.

A method of manufacturing a semiconductor memory device according to an embodiment of the present invention, the method comprises: removing an SOI layer in an element isolation region on an SOI substrate including a semiconductor substrate, an buried insulation film, and the SOI layer; forming an insulation film on a side surface of the SOI layer in an element formation region; forming a plate electrode facing a side surface of the SOI layer via the insulation film, on the buried insulation film in the element isolation region; and forming a MISFET on the SOI layer in the element formation region.

BRIEF DESCRIPTION OF THE DRAWINGS

FIG. 6A to FIG. 6C are a cross-sectional view along an A-A line, a cross-sectional view along a line B-B, and a cross-sectional view along a line C-C, in FIG. 5, respectively;

FIG. 8A to FIG. 8C are a cross-sectional view along a line A-A, a cross-sectional view along a line B-B, and a cross-sectional view along a line C-C, in FIG. 7, respectively;

FIG. 12A to FIG. 12C are a cross-sectional view along a line A-A, a cross-sectional view along a line B-B, and a cross-sectional view along a line C-C, in FIG. 11, respectively;

FIG. 13 is a plan view showing the method of manufacturing the FBC memory according to the second embodiment;

FIG. 14A to FIG. 14C are a cross-sectional view along a line A-A, a cross-sectional view along a line B-B, and a cross-sectional view along a line C-C, in FIG. 13, respectively;

FIG. 16A to FIG. 16C are a cross-sectional view along a line A-A, a cross-sectional view along a line B-B, and a cross-sectional view along a line C-C, in FIG. 15, respectively;

DETAILED DESCRIPTION OF THE INVENTION

Embodiments of the present invention will be explained below in detail with reference to the accompanying drawings. Note that the invention is not limited thereto.

First Embodiment

Figure 1:
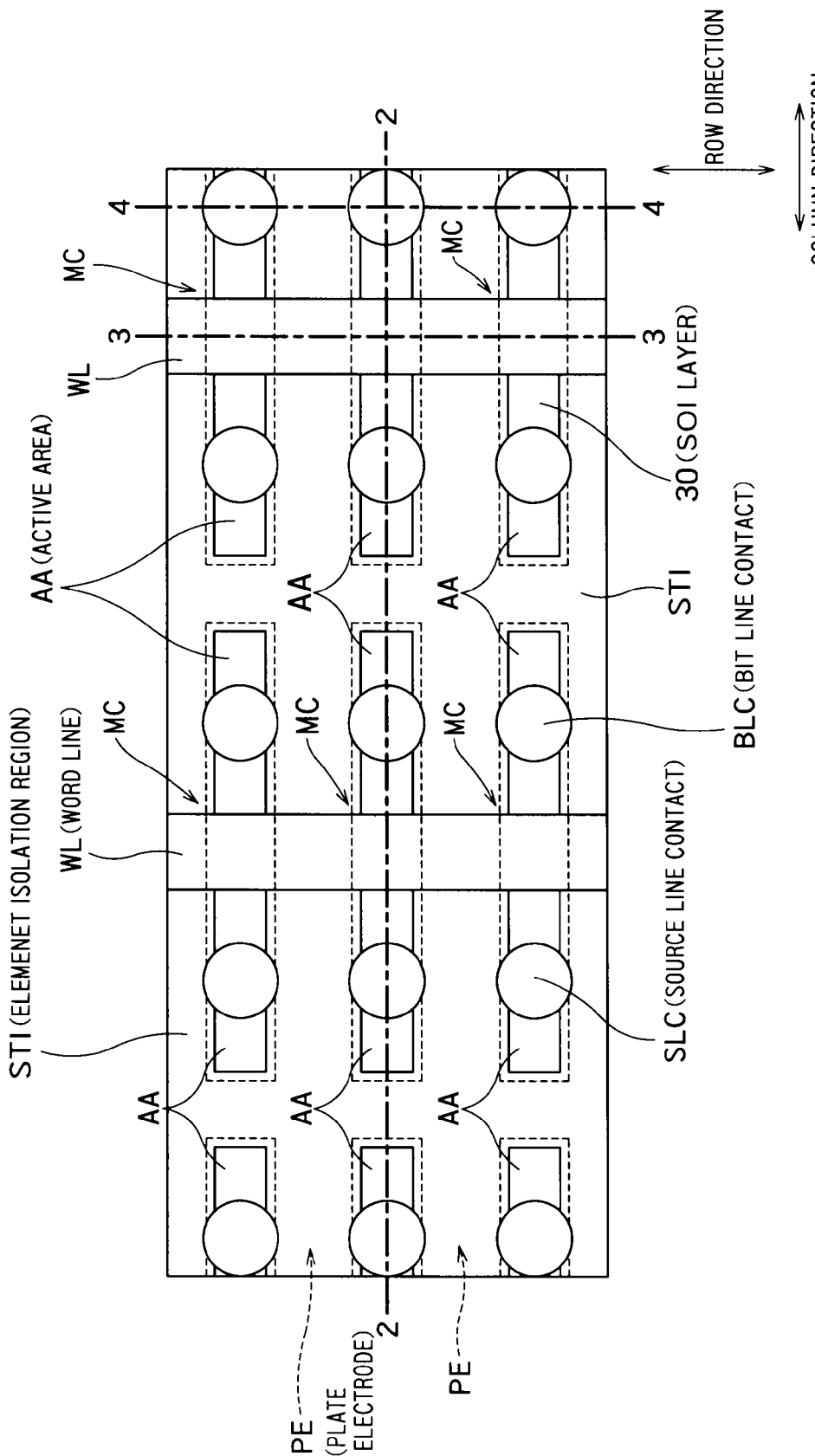
FIG. 1 is a schematic plan view showing one example of a configuration of an FBC memory according to a first embodiment of the present invention.

FIG. 1 is a schematic plan view showing one example of a configuration of an FBC memory according to a first embodiment of the present invention. SOI layers 30 of an SOI substrate are formed in island shapes, and the SOI layers 30 are used for active areas AAs. Memory cells MCs are formed in the active areas AAs. A region not provided with the SOI layers 30 between the active areas AAs is a shallow trench isolation STI. An insulting material such as a silicon oxide film is filled into the shallow trench isolation STI.

The word lines WLs are extended to a row direction, and also have a function of gate electrodes of the memory cells MCs. Bit lines (not shown in FIG. 1) are extended to a column direction so as to pass on bit line contacts BLCs. The memory cells MCs are positioned at intersections between the word lines WLs and the bit lines.

Figure 2:
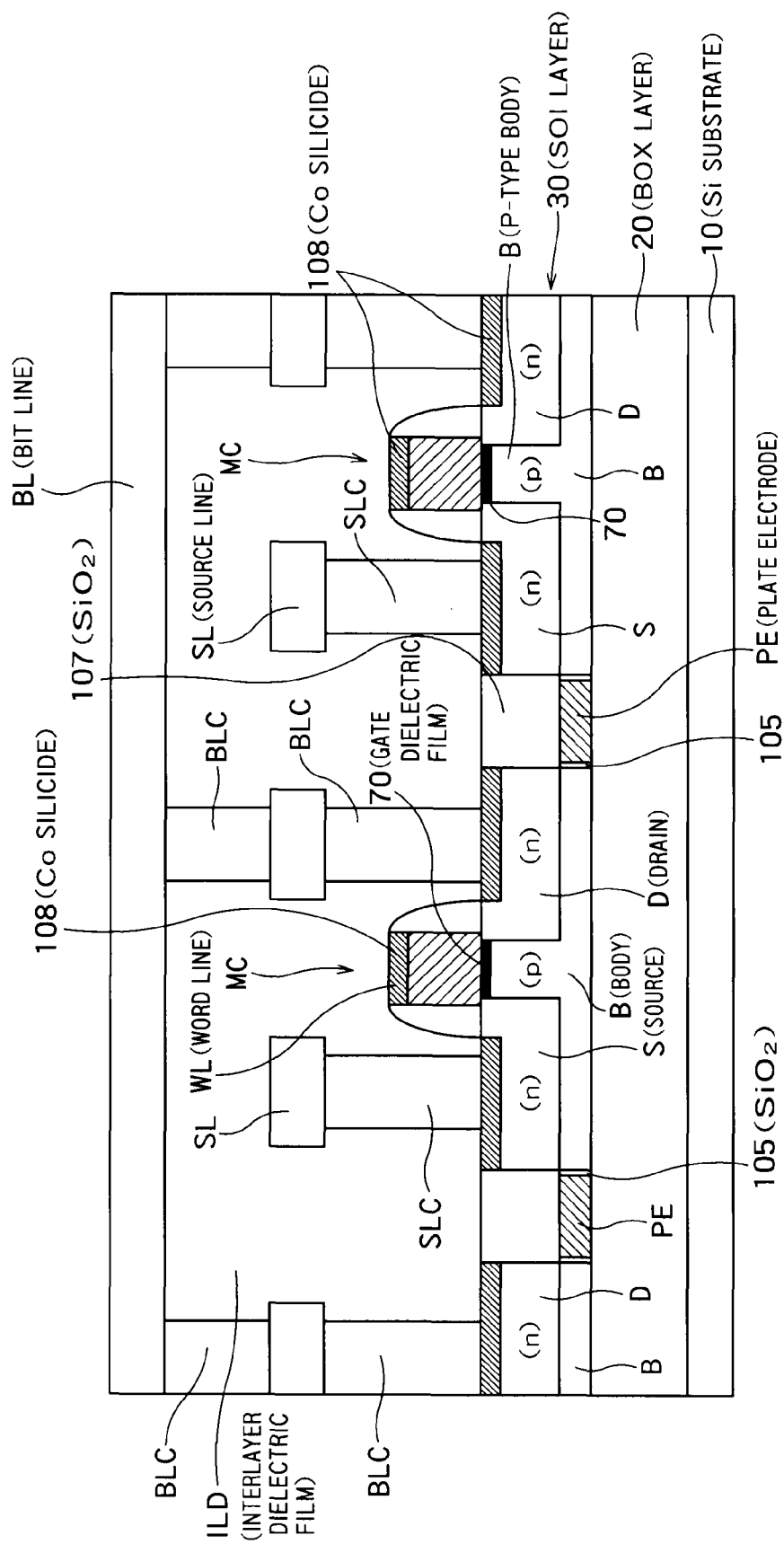
FIG. 2 is a cross-sectional view along a 2-2 line in FIG. 1.
Figure 3:
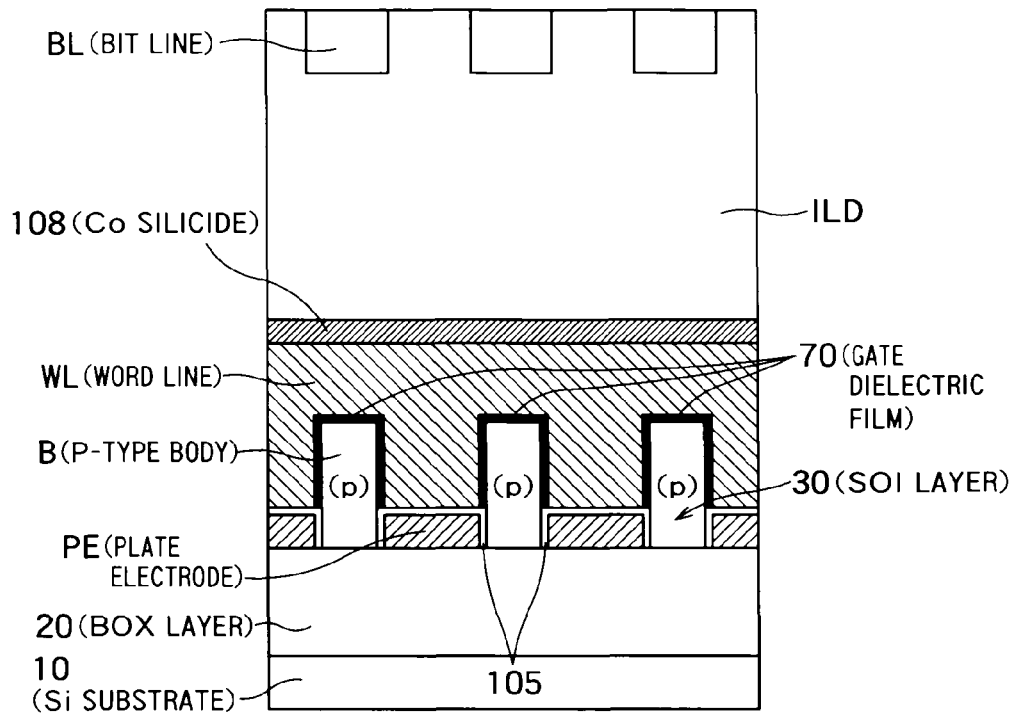
FIG. 3 is a cross-sectional view along a 3-3 line in FIG. 1.
Figure 4:
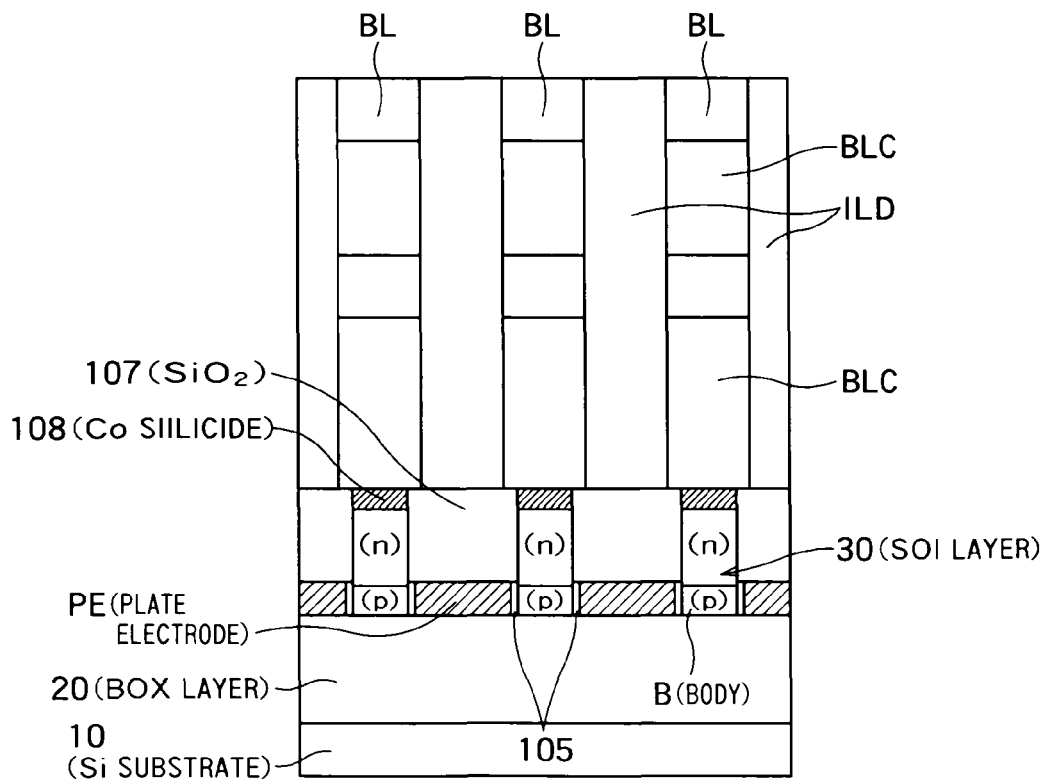
FIG. 4 is a cross-sectional view along a 4-4 line in FIG. 1.

FIG. 2 is a cross-sectional view along a 2-2 line in FIG. 1. FIG. 3 is a cross-sectional view along a 3-3 line in FIG. 1. FIG. 4 is a cross-sectional view along a 4-4 line in FIG. 1. As shown in FIG. 2, the FBC memory according to the first embodiment is formed on the SOI substrate including a silicon substrate 10, an embedded insulation film (BOX (Buried Oxide) layer) 20 provided on a silicon substrate 10, and the SOI layer 30 provided on a BOX layer 20.

An n-type source layer S and an n-type drain layer D are formed in each SOI layer 30. A p-type body region B is provided in each SOI layer 30 between the source layer S and the drain layer D. The body region B is also provided as a p-type semiconductor layer in the SOI layer 30 beneath the source layer S and the drain layer D. In this way, the body region B is formed in a convex shape, with an upper surface area larger than a bottom surface area, on a cross-sectional surface in a bit line BL direction. The body region B is in an electrically floating state by being surrounded by the source layer S, the drain layer D, the BOX layer 20, and silicon oxide films 105 and 107 used for the shallow trench isolation STI.

A gate electric film 70 is provided on each body region B. Each word line WL is provided on the gate electric film 70. The word line WL has a function of a gate electrode of the memory cell MC. The memory cell MC is an n-type MISFET, and can store logic data (for example, binary data) by accumulating or discharging majority carriers (holes) to the body region B. The word line WL is made of doped polysilicon, for example.

The silicon oxide films 105 and 107 are provided as the shallow trench isolation STI between adjacent active areas AAs. The silicon oxide films 105 and 107 isolate the memory cells MCs provided in the active areas AAs.

In the shallow trench isolation STI, plate electrodes PEs are provided to face each other via the silicon oxide film 105 on side surfaces of the body region B. The plate electrodes PEs are not electrically connected to the body region B, but are capacitance-coupled to the body region B, because the plate electrodes PEs face each other via the thin silicon oxide film 105. The plate electrodes PEs are made of doped polysilicon, for example.

A silicide layer 108 of cobalt is provided on upper surfaces of the source layer S, the drain layer D, and the word line WL, respectively. Accordingly, contact resistance and gate resistance to the source layer S and the drain layer D can be minimized. The silicide layer 108 of cobalt can be replaced by another metal silicide layer such as a nickel silicide layer or a titanium silicide layer.

Source lines SLs are connected to the source layer S via source line contacts SLCs. The bit lines BLs are connected to the drain layer D via the bit line contacts BLCs. The source lines SLs, the source line contacts SLCs, the bit lines BLs, and the bit line contacts BLCs are made of metals such as aluminum, copper, and tungsten, or an alloy of these metals. An interlayer dielectric film ILD made of a silicon oxide film is implanted into between the wirings and between the contacts.

As shown in FIG. 2 to FIG. 4, the thin silicon oxide film 105 is provided on the side surface of the body region B. Further, the plate electrode PE faces the side surface of the body region B via the silicon oxide film 105. The plate electrode PE is provided in substantially the whole region of the shallow trench isolation STI shown by a broken line in FIG. 1. That is, the plate electrode PE is provided to surround the periphery of each island-shaped active area AA (the body region B), and is also electrically isolated from each active area AA (the body region B).

One example of a method of writing data into the memory cells MCs of the FBC memory is explained below. To write the data "1" into the memory cells MCs, the memory cells MCs are operated in a saturation state. For example, the word lines WLs are biased to 1.5 V, and the bit lines are biased to 1.5 V. A source is at a ground GND (0 V) level. With this arrangement, impact ionization occurs near the drain layer D, and a large amount of electron-hole pairs occur. Electrons generated by the impact ionization flow to the drain layer D, and holes are accumulated in the body region B at a low potential. When the current flowing at the time of generating the holes by the impact ionization is balanced with a forward current at a pn junction between the body and the source, a body voltage reaches an equilibrium state. This body voltage is about 0.7 V.

At the time of writing the data "0", a voltage of the bit lines BLs is lowered to a negative voltage. For example, a potential of the bit lines BLs is lowered to −1.5 V. Based on this operation, a pn junction between the body and the drain is biased to a forward direction to a large extent. The holes accumulated in the body region B are discharged to the drain layer D, and the data "0" is stored in the memory cells MCs.

One example of a method of reading data from the memory cells MCs is explained below. In the data reading operation, the word lines WLs are activated in a similar manner to that of the data writing operation, or potentials of the bit lines BLs are set lower than those at the data "1" writing time. For example, the word lines WLs are set to 1.5 V, and the bit lines BLs are set to 0.2 V. With this arrangement, the memory cells MCs are operated in a linear region. The memory cells MCs storing the data "0" and the memory cells MCs storing the data "1" are different from each other in threshold voltages of the memory cells MCs due to a difference between the numbers of holes accumulated in the body regions Bs. A sense amplifier detects this difference between the threshold voltages, and identifies the data "1" and the data "0". The bit lines BLs are set to a low voltage at the data reading, for the following reason. When the voltages of the bit lines BLs are set high and also when the memory cells MCs are biased to a saturation state, there is a risk that the data "0" is changed to the data "1" by impact ionization at the data "0" reading time.

A potential of the plate electrode PE is fixed, in the data writing and the data reading. In this case, the potential of the plate electrode PE is −2 V, for example.

According to the first embodiment, capacitance between the body region B and the plate electrode PE is added to the capacitance between the body region B and the substrate 10 functioning as a channel. Accordingly, capacitance between the body region B and a fixed electrode (10, PE) increases. As a result, a signal amount of the memory cells MCs (a signal difference between the data "1" and the data "0") can be increased. To increase the capacitance between the body region B and the plate electrode PE, preferably, a height (a thickness) of the plate electrode PE from the surface of the BOX layer 20 is substantially equal to or larger than that of the side surface of the adjacent body regions Bs.

Preferably, the body region B has a larger bottom surface area than that of an upper surface, on a cross section in a bit line BL direction. Therefore, capacitance between the silicon substrate 10 and the body region B becomes large. At the same time, a lower side surface of the body region B (a side surface of the body region B beneath the source layer S and the drain layer D) is adjacent to the vicinity of the plate electrode PE, due to the convex shape of the body region B. Therefore, the capacitance between the body region B and the fixed electrode (10, PE) increases.

A depth of the diffusion layer of the source layer S and the drain layer D can be equal to or smaller than a half of a height (thickness) of the SOI layer 30. In this case, a height (thickness) of the body region B beneath the source layer S and the drain layer D becomes high (thick). By increasing the height (thickness) of the plate electrode PE following this, capacitance between the body region B and the plate electrode PE can be increased. The height of the layer is a height of the upper surface from the bottom surface of this layer as a basis. Hereinafter, a layer height is also called a layer thickness.

According to the first embodiment, the height of the body region B is larger than the width of the body region B as shown in FIG. 3. Accordingly, the word line WL also faces the side surface of the body region B. Capacitance between the body region B and the fixed electrode (10, PE) can be secured, by providing the plate electrode PE according to the first embodiment in a FIN-type FBC memory having large capacitance between the body and the gate (the word lines) like this. As a result, even the FIN-type FBC memory can restrict a reduction in a signal amount. Increase in the signal amount can be also expected by applying the first embodiment to a plane surface FBC memory.

Figure 5:
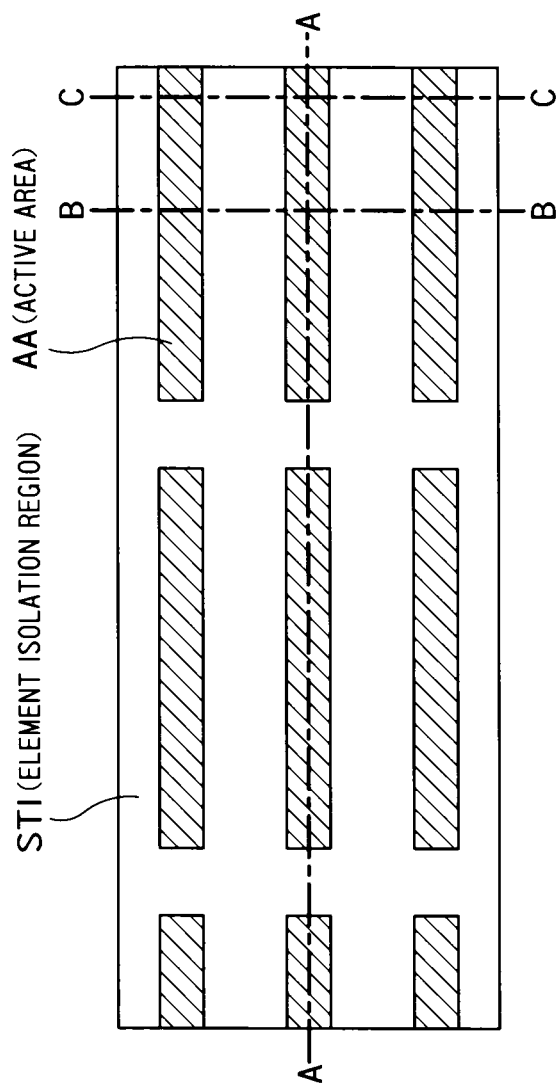
FIG. 5 is a plan view showing the method of manufacturing the FBC memory according to the first embodiment.

A method of manufacturing the FBC memory according to the first embodiment is explained next. FIG. 5 is a plan view showing the method of manufacturing the FBC memory according to the first embodiment. FIG. 6A to FIG. 6C are a cross-sectional view along an A-A line, a cross-sectional view along a line B-B, and a cross-sectional view along a line C-C, in FIG. 5, respectively. First, an SOI substrate including the silicon substrate 10, the BOX layer 20, and the SOI layer 30 is prepared. The BOX layer 20 has a thickness of 150 nm, for example, and the SOI layer 30 has a thickness of 50 nm, for example.

Next, a silicon nitride film 115 as a mask material is deposited on the SOI layer 30. The silicon nitride film 115 has a thickness of about 20 nm, for example. The silicon nitride film 115 is patterned to remain on the active area AA, using lithography and RIE (Reactive Ion Etching). As a result, the silicon nitride film 115 covers the SOI layer 30 of the active area AA, and does not cover the SOI layer 30 in the shallow trench isolation STI. That is the SOI layer 30 in the shallow trench isolation STI is exposed. The SOI layer 30 is anisotropically etched using the patterned silicon nitride film 115 as a mask. With this arrangement, the SOI layer 30 in the shallow trench isolation STI is removed by leaving the SOI layer 30 in the active area AA as it is. By this etching, the SOI layer 30 is formed in an island shape.

Figure 7:
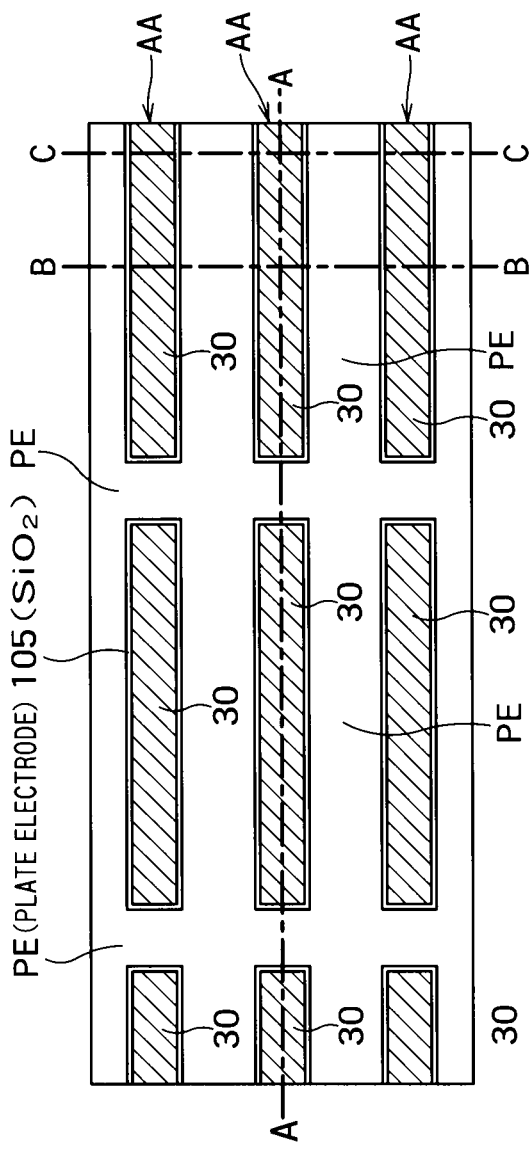
FIG. 7 is a plan view showing the method of manufacturing the FBC memory following FIG. 5.

FIG. 7 is a plan view showing the method of manufacturing the FBC memory following FIG. 5. FIG. 8A to FIG. 8C are a cross-sectional view along a line A-A, a cross-sectional view along a line B-B, and a cross-sectional view along a line C-C, in FIG. 7, respectively. The silicon oxide film 105 is formed by thermal oxidization on a side surface of the SOI layer 30 formed in an island shape in the active area AA. The silicon oxide film 105 has a thickness of 5 nm, for example.

Next, polysilicon doped with phosphorus is deposited. Polysilicon is deposited in a thickness of 400 nm, for example. Polysilicon is etched back, using RIE. As a result, polysilicon is left at the bottom of the shallow trench isolation STI. The etched-back polysilicon becomes a plate electrode PE as shown in FIG. 8A to FIG. 8C. The plate electrode PE has a thickness of about 20 nm. In this case, a side surface of the plate electrode PE faces the side surface of the SOI layer 30 in the active area AA via the silicon oxide film 105. The plate electrode PE is formed to surround the periphery of the SOI layer 30 in the active area AA as shown in FIG. 7. Preferably, the plate electrode PE has a height (thickness) substantially equal to or larger than the height (thickness) of the side surface of the adjacent body area B.

Figure 9:
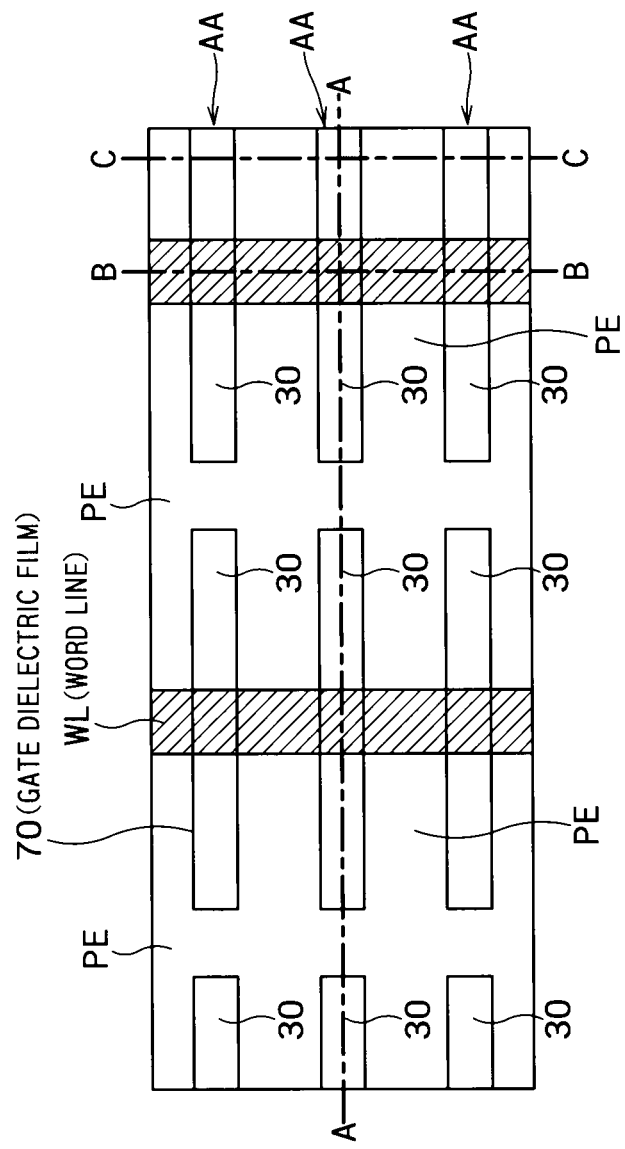
FIG. 9 is a plan view showing the method of manufacturing the FBC memory following FIG. 7.
Figure 10:
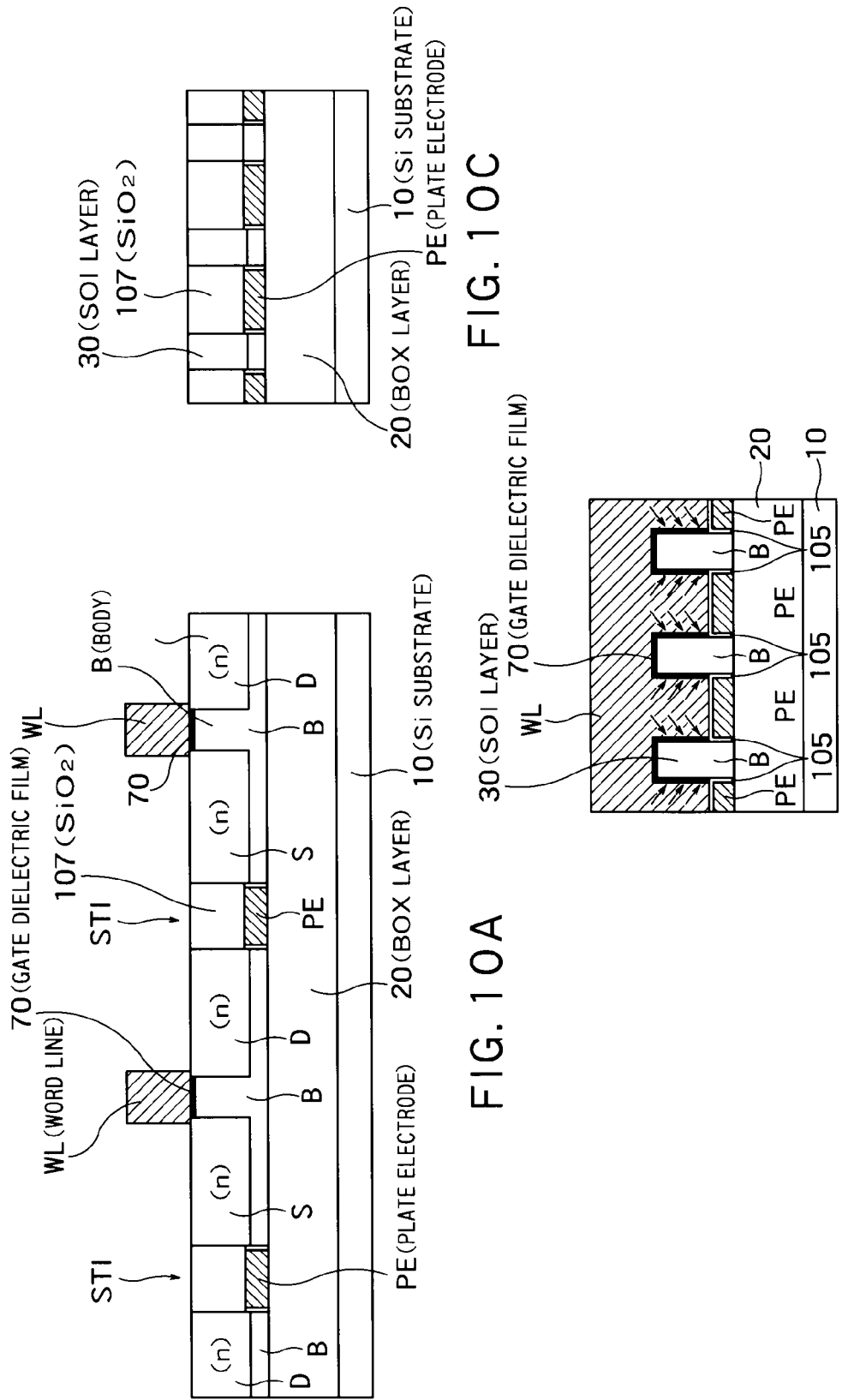
FIG. 10A to FIG. 10C are a cross-sectional view along a line A-A, a cross-sectional view along a line B-B, and a cross-sectional view along a line C-C, in FIG. 9, respectively.

FIG. 9 is a plan view showing the method of manufacturing the FBC memory following FIG. 7. FIG. 10A to FIG. 10C are a cross-sectional view along a line A-A, a cross-sectional view along a line B-B, and a cross-sectional view along a line C-C, in FIG. 9, respectively. After the silicon nitride film 115 is removed, the SOI layer 30 is thermally oxidized, thereby forming a gate dielectric film 70 on the surface of the SOI layer 30 including the upper surface and the side of the body region B. Next, doped polysilicon as a word line material is deposited on the gate dielectric film 70. This polysilicon is processed into a pattern of the word line WL, using lithography and RIE. As a result, the word line WL (the gate electrode) is formed on the gate dielectric film 70. As shown in FIG. 10B, the word line WL faces the upper surface of the body region B via the gate dielectric film 70, and further faces the side surface of the body region B via the gate dielectric film 70. A width of the word line WL, that is, a gate length of the memory cell MC, is 20 nm, for example.

Next, arsenic or phosphorus is ion implanted into the SOI layer 30, using the word line WL as a mask. In this case, as shown by an arrowhead in FIG. 10B, the ion implantation is performed to the side surface of the body region B from an inclined direction. As a result, as shown in FIG. 10A, impurity is implanted into only the upper part of the SOI layer 30, using the gate electrode (the word line WL) and the plate electrode PE as masks. As a result, the body region B can be left at the bottom of the SOI layer 30. That is, when the ion implantation is used, the body region B can be formed in a convex shape. Further, thermal treatment is performed to activate the ion-implanted impurity. As a result, an n-type diffusion layer is formed in each SOI layer 30 at both sides of the word line WL. These n-type diffusion layers are the source layer S and the drain layer D. According to need, n-type extension layers extending from the source layer S and the drain layer D to the channel can be formed.

Next, a silicon oxide film is deposited, and this silicon oxide film is etched back. As a result, the silicon oxide film 107 is embedded into the shallow trench isolation STI as shown in FIG. 10A and FIG. 10C.

Figure 11:
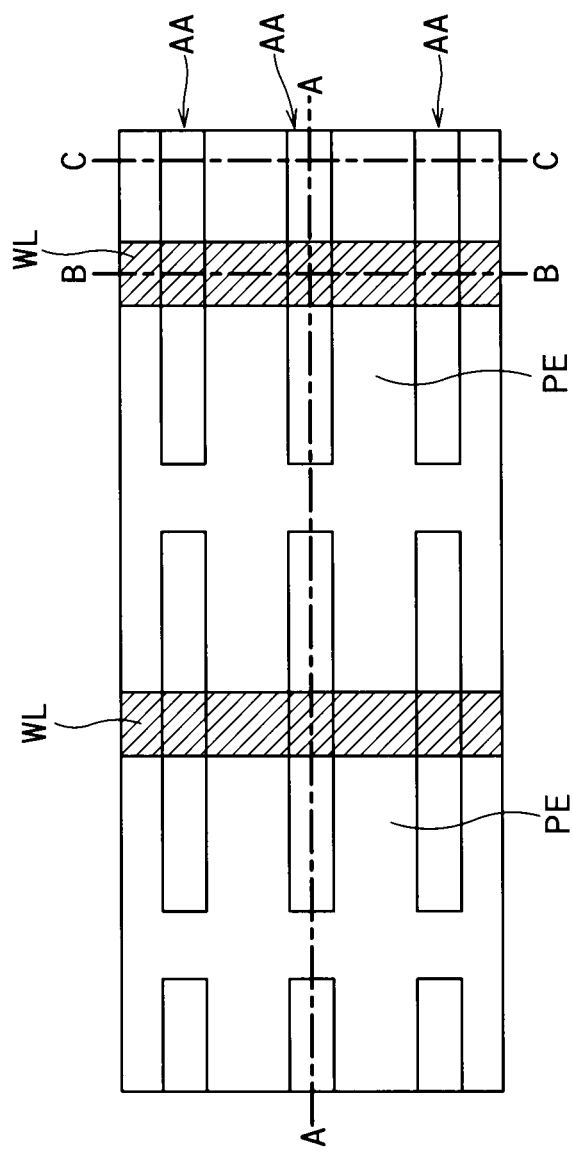
FIG. 11 is a plan view showing the method of manufacturing the FBC memory following FIG. 9.

FIG. 11 is a plan view showing the method of manufacturing the FBC memory following FIG. 9. FIG. 12A to FIG. 12C are a cross-sectional view along a line A-A, a cross-sectional view along a line B-B, and a cross-sectional view along a line C-C, in FIG. 11, respectively. After the silicon oxide film 107 is implanted into the shallow trench isolation STI, a spacer SP is formed on a side surface of the word line WL. The spacer SP includes an insulation film such as a silicon oxide film and a silicon nitride film, for example. A metal film is deposited on the word line WL, the source layer S, and the drain layer D, and this metal film is reacted with silicon. As a result, the silicide layer 108 is formed on the upper surfaces of the word line WL, the source layer S, and the drain layer D. The silicide layer 108 is made of low-resistance metal silicide such as cobalt silicide, nickel silicide, and titanium silicide.

Thereafter, as shown in FIG. 1 to FIG. 4, the interlayer dielectric film ILD is deposited, and the source line contacts SLCs, the bit line contacts BLCs, the source lines SLs, and the bit lines BLs are formed. The source line contacts SLCs, the bit line contacts BLCs, the source lines SLs, and the bit lines BLs are made of metals such as aluminum and copper.

Second Embodiment

A method of manufacturing an FBC memory according to a second embodiment is different from that of the first embodiment in that the word lines WLs are formed by using a damascene process. Other manufacturing processes according to the second embodiment can be identical to the manufacturing method according to the first embodiment. The configuration of the FBC memory formed by the manufacturing method according to the second embodiment is identical to the configuration of the FBC memory according to the first embodiment.

FIG. 13 is a plan view showing the method of manufacturing the FBC memory according to the second embodiment. FIG. 14A to FIG. 14C are a cross-sectional view along a line A-A, a cross-sectional view along a line B-B, and a cross-sectional view along a line C-C, in FIG. 13, respectively. After the process shown in FIG. 5 to FIG. 8C is performed, the interlayer dielectric films ILDs are deposited on the shallow trench isolations STIs and the active areas AAs.

Next, the interlayer dielectric films ILDs and the silicon nitride film 115 in the forming regions of the word lines WLs are removed, using lithography and RIE. As a result, trenches are formed in the forming regions of the word lines WLs. The SOI layers 30 are exposed at the bottoms of the trenches.

Figure 15:
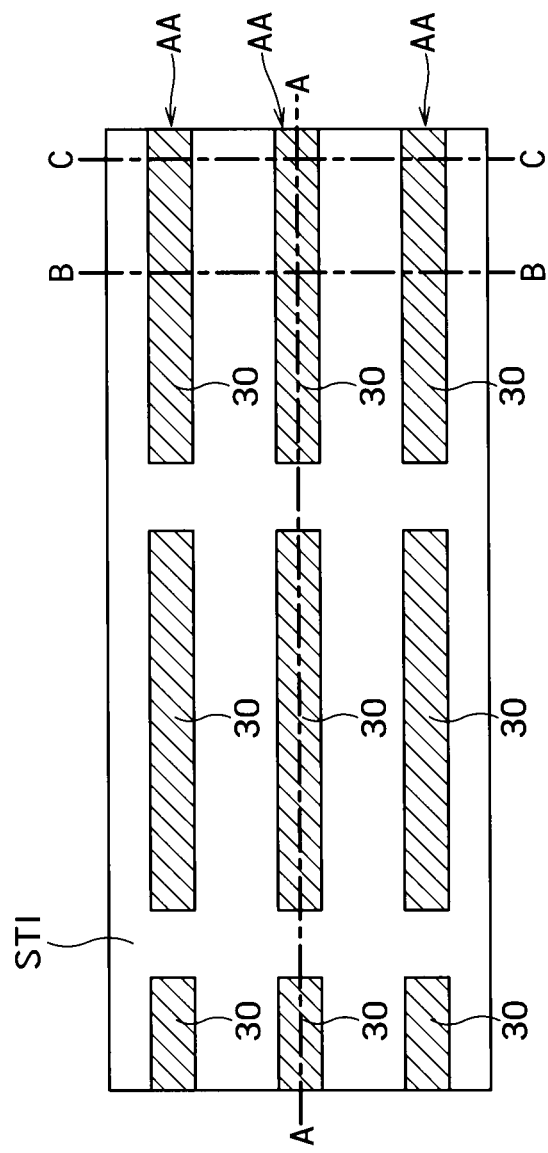
FIG. 15 is a plan view showing the method of manufacturing the FBC memory following FIG. 13.

FIG. 15 is a plan view showing the method of manufacturing the FBC memory following FIG. 13. FIG. 16A to FIG. 16C are a cross-sectional view along a line A-A, a cross-sectional view along a line B-B, and a cross-sectional view along a line C-C, in FIG. 15, respectively. As shown in FIG. 16A, the gate dielectric films 70 are formed on the exposed SOI layers 30.

Subsequently, doped polysilicon is deposited on the gate dielectric films 70 and the interlayer dielectric films ILDs. The doped polysilicon has a film thickness larger than the film thicknesses of the silicon nitride film 115 and the interlayer dielectric films ILDs on the SOI layers 30. For example, the doped polysilicon has a film thickness of 100 nm. The trenches in the forming regions of the word lines WLs are implanted with doped polysilicon. By etching back this doped polysilicon, doped polysilicon in the trenches in the forming regions of the word lines WLs is left as it is. As a result, the word lines WLs made of doped polysilicon are formed on the gate dielectric films 70.

After the interlayer dielectric films ILDs and the silicon nitride films 115 are removed, ion implantation is performed from an inclined direction as explained with reference to FIG. 10B. Thereafter, the FBC memory is completed through processes identical to those in the first embodiment.

In the second embodiment, the silicon nitride film 115 is removed after processing the word lines WLs. However, the source layers Ss and the drain layer Ds can be also formed by performing the ion implantation from the inclined direction without removing the silicon nitride film 115.

The FBC memory formed by the second embodiment has an identical configuration as the FBC memory of the first embodiment, and therefore the second embodiment can archive the same effects as those of the first embodiment.

Third Embodiment

Figure 17:
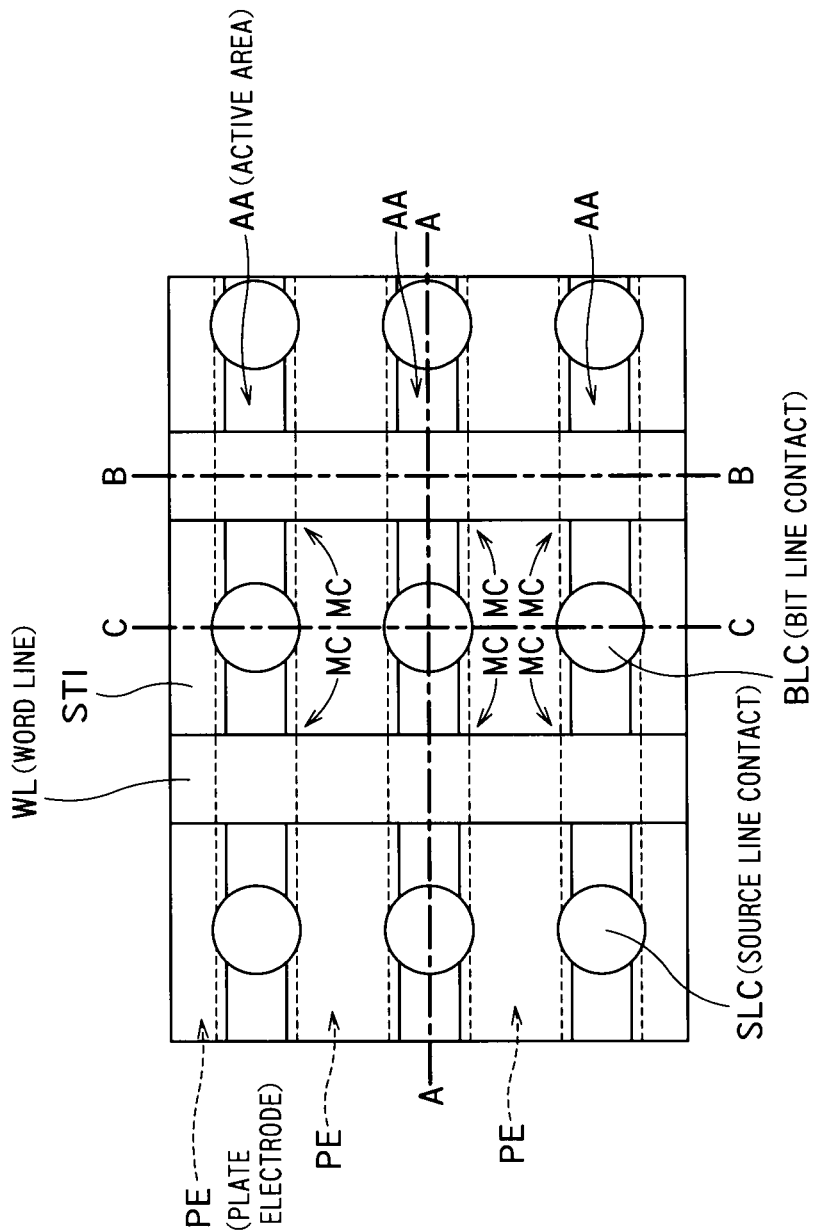
FIG. 17 is a plan view of an FBC memory according to a third embodiment of the present invention.
Figure 18:
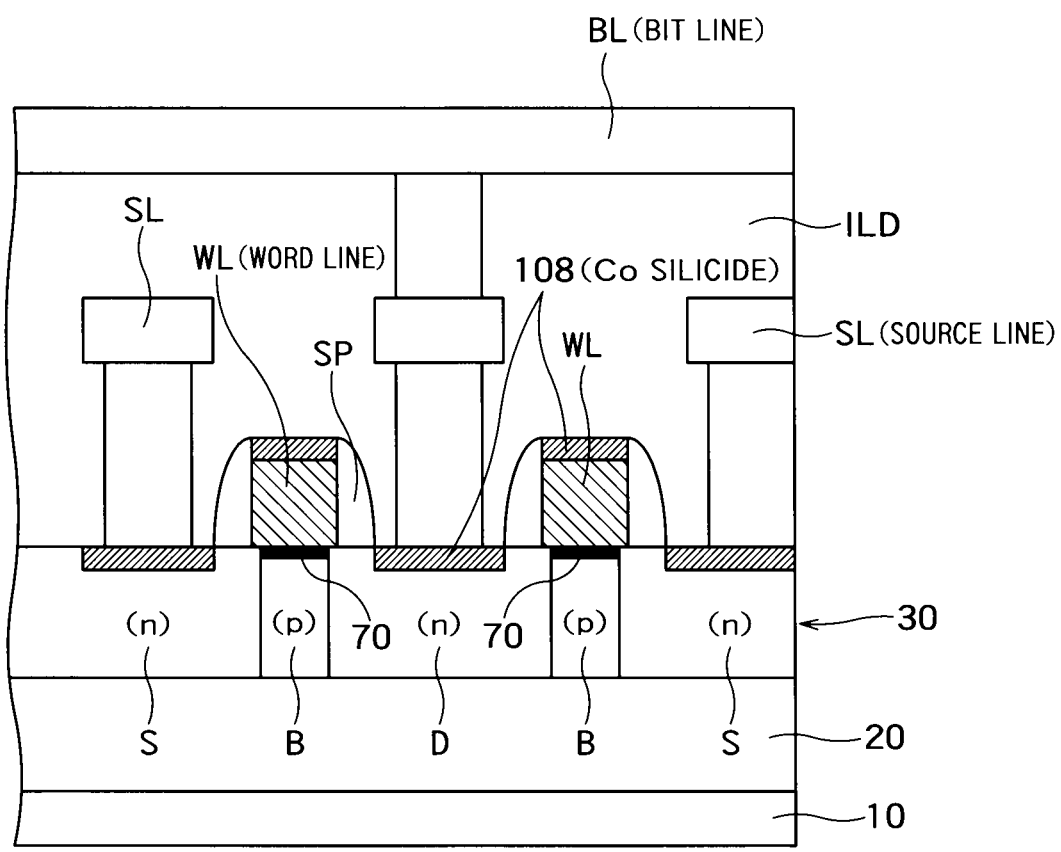
FIG. 18 to FIG. 20 are a cross-sectional view along a line A-A, a cross-sectional view along a line B-B, and a cross-sectional view along a line C-C, in FIG. 17, respectively.
Figure 19:
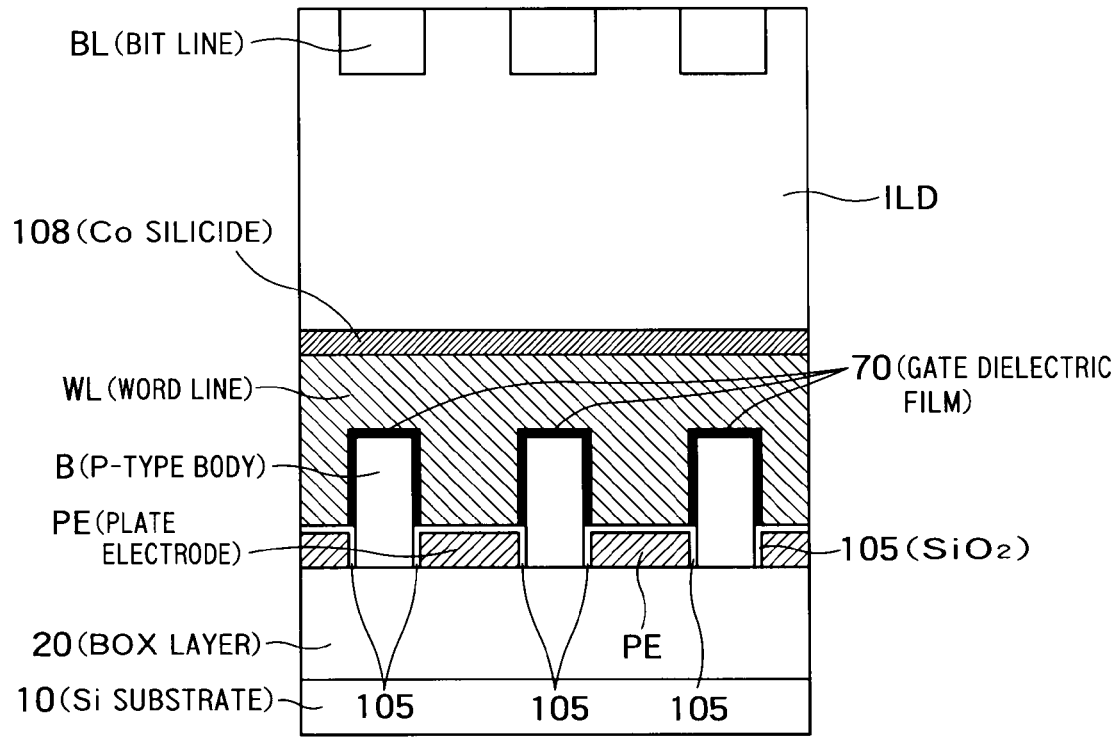
Figure 20:
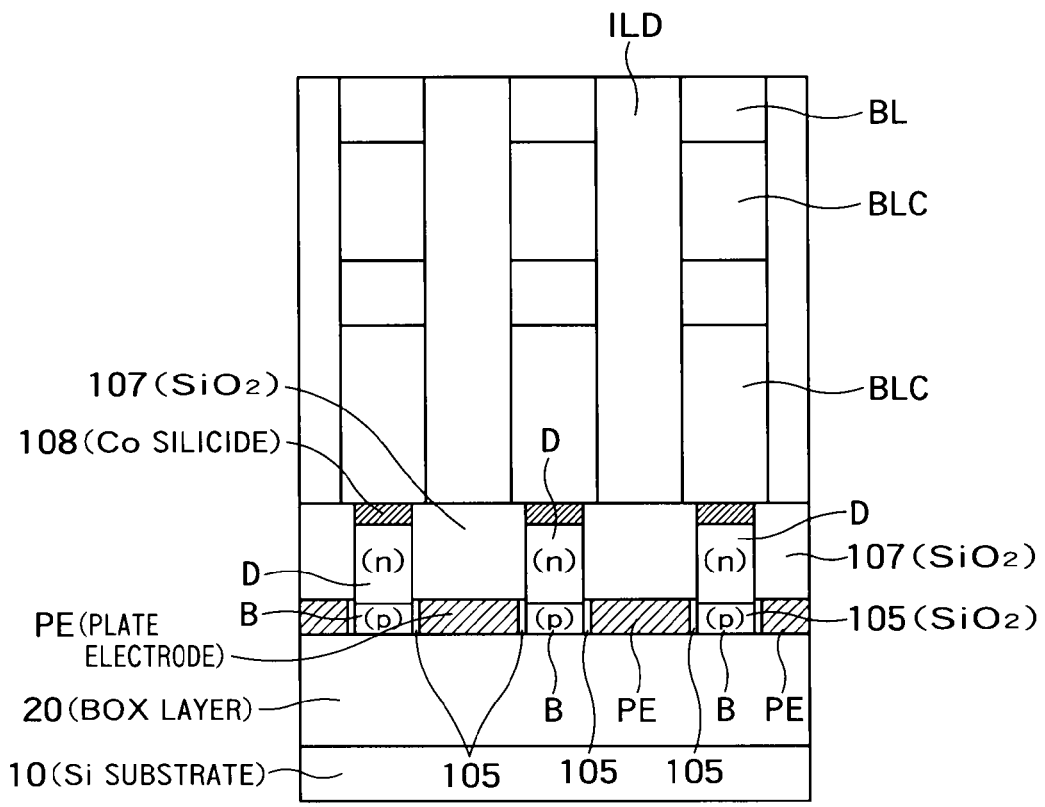

FIG. 17 is a plan view of an FBC memory according to a third embodiment of the present invention. FIG. 18 to FIG. 20 are a cross-sectional view along a line A-A, a cross-sectional view along a line B-B, and a cross-sectional view along a line C-C, in FIG. 17, respectively. In the third embodiment, as shown in FIG. 17 and FIG. 18, the active areas AAs (the SOI layers 30) are continuous in a stripe shape in a bit line direction. Other configurations in the third embodiment can be identical to those in the first embodiment.

The shallow trench isolations STIs are provided between the adjacent active area AAs. Consequently, the shallow trench isolations STIs are also formed in a stripe. Because the plate electrodes PEs are formed in the shallow trench isolations STIs, the plate electrodes PEs are provided in a stripe shape in broken-line regions shown in FIG. 17.

In the third embodiment, because the active areas AAs are continuous in a bit line direction, the bit line contacts BLCs and the source line contacts SLCs are shared by adjacent two memory cells MCs in a bit line direction. Accordingly, a chip size of the FBC memory becomes small. Further, the third embodiment can achieve the same effects as those of the first embodiment.

Fourth Embodiment

Figure 21:
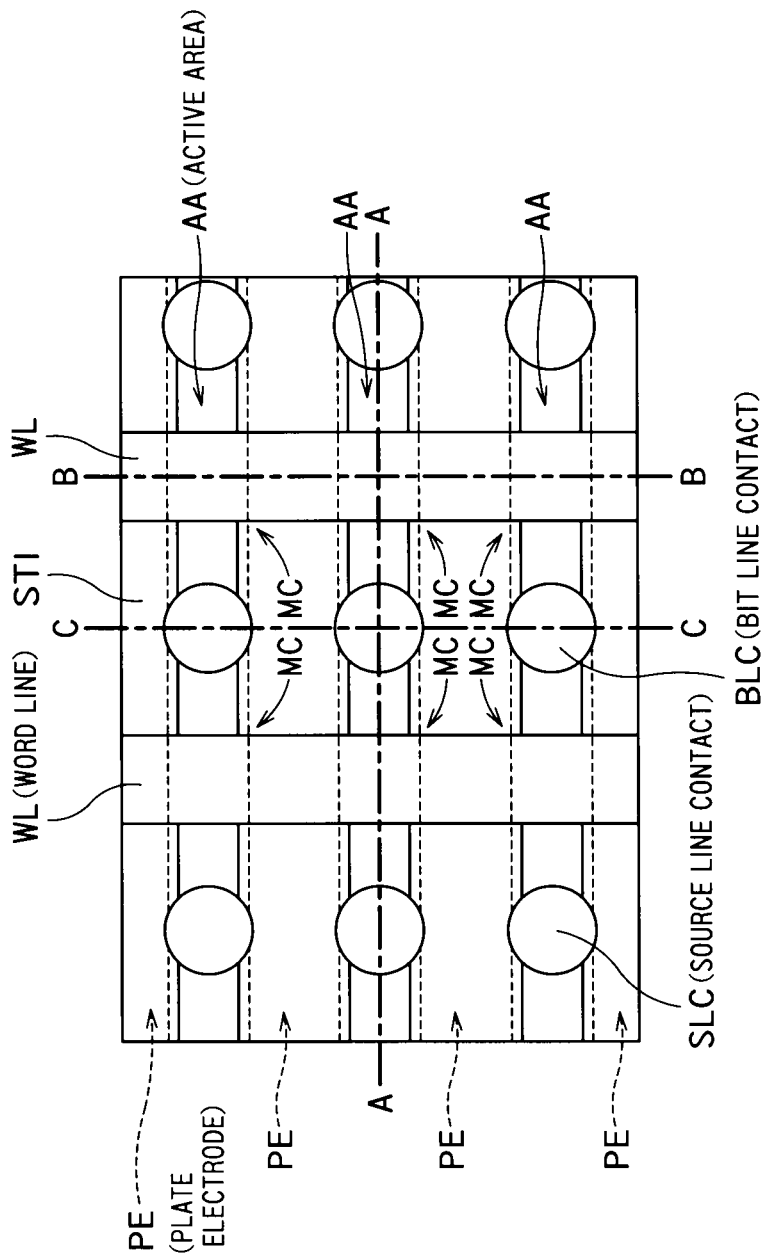
FIG. 21 is a plan view of an FBC memory according to a fourth embodiment of the present invention.
Figure 22:
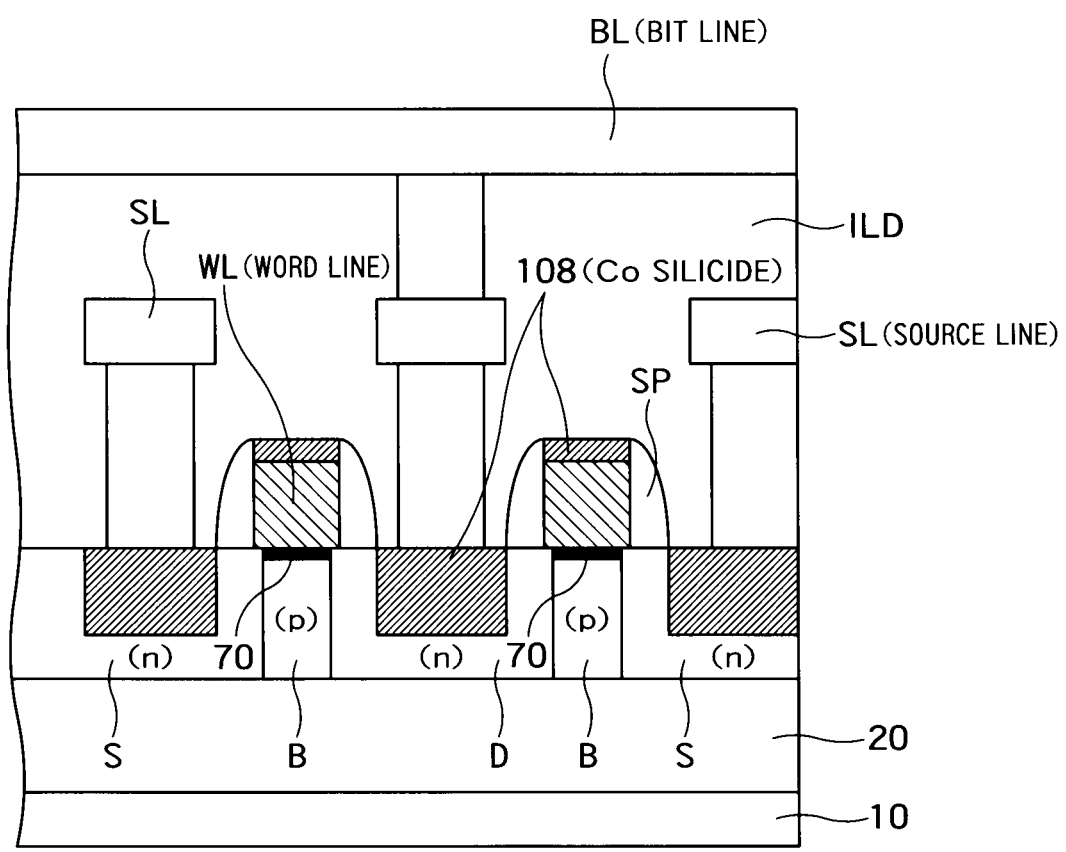
FIG. 22 to FIG. 24 are a cross-sectional view along a line A-A, a cross-sectional view along a line B-B, and a cross-sectional view along a line C-C, in FIG. 21, respectively.
Figure 23:
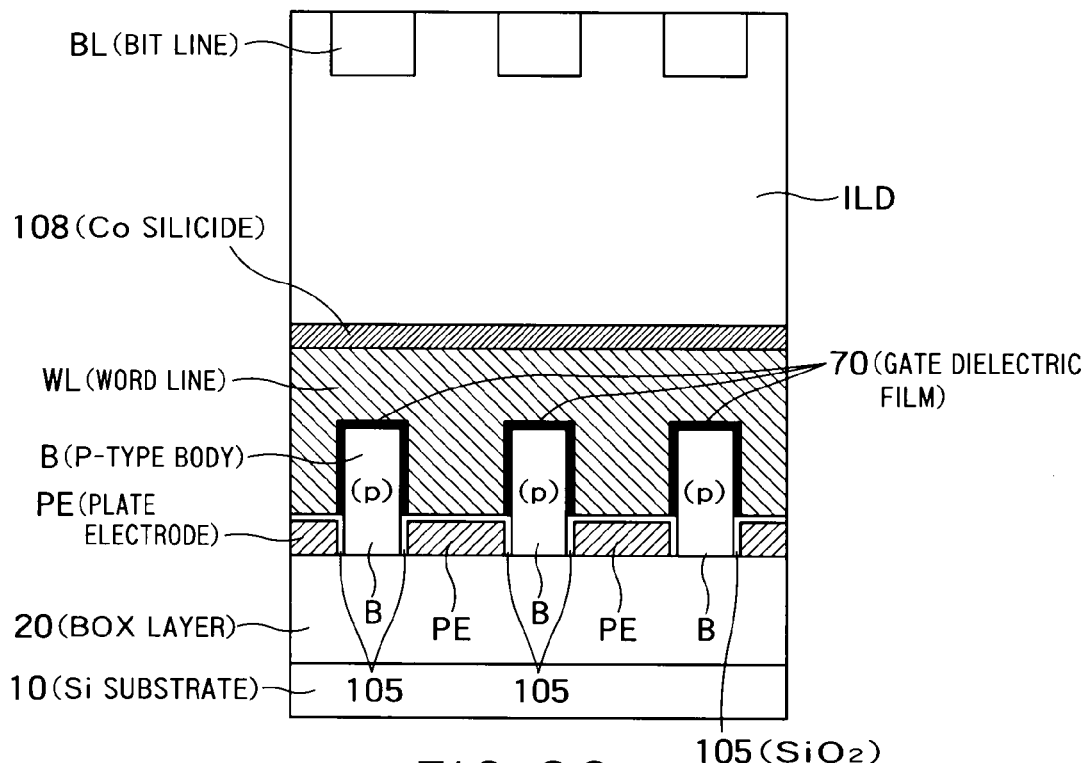
Figure 24:
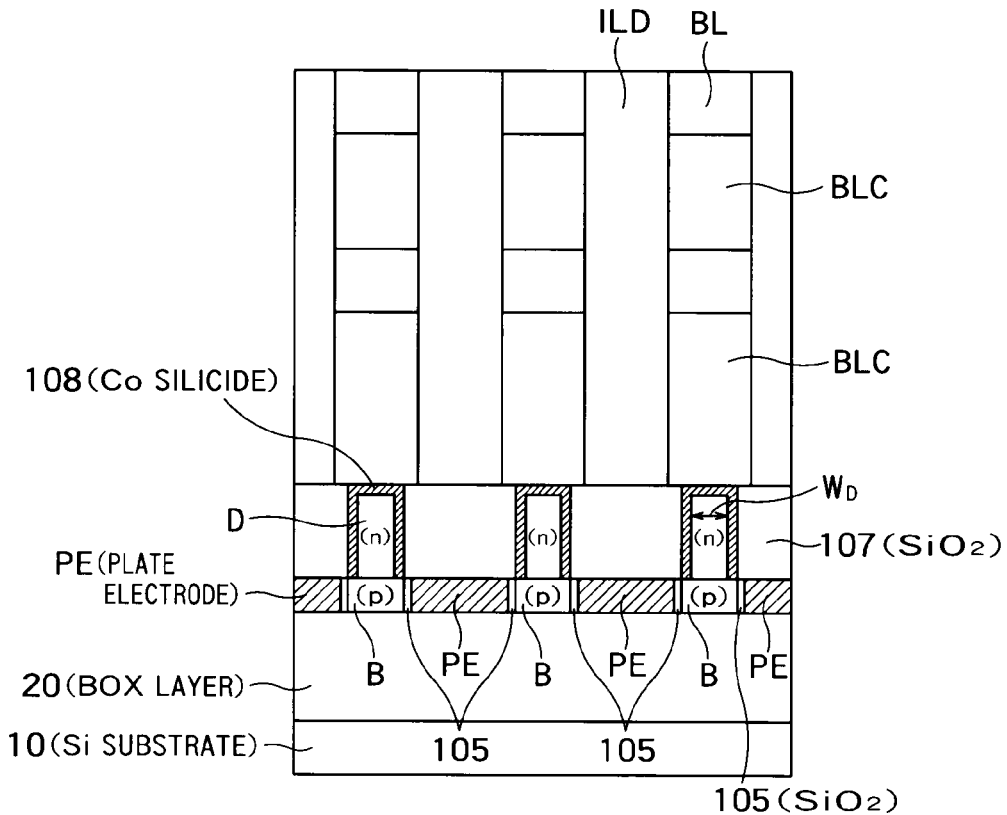

FIG. 21 is a plan view of an FBC memory according to a fourth embodiment of the present invention. FIG. 22 to FIG. 24 are a cross-sectional view along a line A-A, a cross-sectional view along a line B-B, and a cross-sectional view along a line C-C, in FIG. 21, respectively. The fourth embodiment is different from the third embodiment in that, as shown in FIG. 22 to FIG. 24, the silicide layers 108 are provided on both side surfaces of the source layers Ss and the drain layers Ds, not only on the upper surfaces thereof. Other configurations in the fourth embodiment can be identical to those in the third embodiment. Therefore, in the fourth embodiment, as shown in FIG. 21, the active areas AAs (the SOI layers 30) are continuous in a stripe shape in a bit line direction. The bit line contacts BLCs and the source line contacts SLCs are shared by adjacent two memory cells MCs in a bit line direction. While a cross-sectional view of the portion of the source layers Ss is omitted, the silicide layers 108 provided on the source layers Ss are provided on the upper surface and on both side surfaces of the source layers Ss, like the silicide layers 108 provided on the drain layers Ds.

The silicide layers 108 are provided not only on the upper surface but also on both side surfaces of the source layers Ss and the drain layers Ds, respectively. Accordingly, contact parasitic resistance in the source layers Ss and the drain layers Ds decreases. As a result, current driving capacity of the FIN-type FBC increases.

Because the silicide layers 108 are provided on both side surfaces of the source layers Ss and the drain layers Ds, respectively, a width WD of the source layers Ss and the drain layers Ds in a word line direction becomes smaller than that in the third embodiment, as shown in FIG. 24. As a result, a phenomenon (bipolar disturb) that holes accumulated in the body regions Bs of the memory cell MC penetrate into the adjacent memory cells MCs can be restricted. By restricting the bipolar disturb, degradation of a signal in the memory cells MCs can be restricted. This is because the holes discharged from the channels in the body region B to the source layers Ss or drain layer Ds are absorbed by the silicide layers 108, and do not reach the body regions Bs on the adjacent memory cells. Further, the fourth embodiment can achieve the same effects as those of the third embodiment.

The invention claimed is:
1. A semiconductor memory device comprising:
a semiconductor substrate;

a buried insulation film provided on the semiconductor substrate;

a semiconductor layer provided on the buried insulation film;

an element isolation region provided between active areas which are formed in the semiconductor layer;

a source layer and a drain layer provided in the semiconductor layer;

a body region provided in the semiconductor layer between the source layer and the drain layer and beneath the source layer and the drain layer, and being in an electrically floating state, the body region accumulating or discharging charges to store data;

a gate dielectric film provided on the body region;

a gate electrode provided on the gate dielectric film; and a plate electrode facing a side surface of the body region via an insulation film, in the element isolation region;

wherein the gate electrode faces an upper surface and both side surfaces of the body region via the gate dielectric film, and a bottom surface of the plate electrode is a substantially same level with that of the body region, a thickness of the plate electrode is substantially equal to that of a side part of the body region beneath the source layer and the drain layer.

2. The semiconductor memory device according to claim 1, wherein a potential of the plate electrode is fixed at data writing operation and data reading operation.

3. The semiconductor memory device according to claim 1, wherein the body region has a convex shape on a cross section along a layout direction of the source layer, the body region, and the drain layer, and the plate electrode faces a lower side surface of the body region.

4. The semiconductor memory device according to claim 1, wherein the semiconductor layer is continuous in a layout direction of the source layer, the body region, and the drain layer.

5. The semiconductor memory device according to claim 1, further comprising silicide layers provided on an upper surface and on both side surfaces of the source layer and the drain layer, respectively, wherein the source layer, the drain layer, the body region, and the gate electrode form a memory cell, and two of a plurality of memory cells adjacent in an extension direction of the active areas share the source layer or the drain layer.

* * * * *